(12) United States Patent
Bacha

(10) Patent No.: US 10,109,370 B2
(45) Date of Patent: Oct. 23, 2018

(54) TEMPLATE COPY TO CACHE

(71) Applicant: Hewlett Packard Enterprise Development LP, Houston, TX (US)

(72) Inventor: Anys Bacha, Dublin, OH (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 0 days.

(21) Appl. No.: 15/324,404

(22) PCT Filed: Jul. 31, 2014

(86) PCT No.: PCT/US2014/049026
§ 371 (c)(1),
(2) Date: Jan. 6, 2017

(87) PCT Pub. No.: WO2016/018334
PCT Pub. Date: Feb. 4, 2016

(65) Prior Publication Data
US 2017/0200509 A1    Jul. 13, 2017

(51) Int. Cl.
*G11C 29/38* (2006.01)
*G11C 29/36* (2006.01)
*G11C 29/00* (2006.01)

(52) U.S. Cl.
CPC .............. *G11C 29/38* (2013.01); *G11C 29/36* (2013.01)

(58) Field of Classification Search
None
See application file for complete search history.

(56) References Cited

U.S. PATENT DOCUMENTS

| | | | |
|---|---|---|---|
| 5,793,941 A | 8/1998 | Pencis et al. | |
| 7,539,902 B2 | 5/2009 | Aluru | |
| 7,661,023 B2* | 2/2010 | Arora | G06F 11/261 |
| | | | 714/10 |
| 7,747,908 B2* | 6/2010 | Choudhury | G06F 11/263 |
| | | | 714/32 |
| 8,468,294 B2 | 6/2013 | Huang et al. | |
| 2005/0257034 A1 | 11/2005 | Caprioli et al. | |
| 2011/0131031 A1 | 6/2011 | Katz et al. | |
| 2013/0339612 A1 | 12/2013 | Suzuki et al. | |
| 2014/0032968 A1 | 1/2014 | Nandam et al. | |
| 2017/0123981 A1* | 5/2017 | Bacha | G06F 12/0811 |

FOREIGN PATENT DOCUMENTS

WO    WO-2007071606    6/2007

OTHER PUBLICATIONS

Carlo et al.; "Software-based Self-test of Set-associative Cache Memories", Jul. 2011, 15 Pgs.

(Continued)

*Primary Examiner* — Justin R Knapp
(74) *Attorney, Agent, or Firm* — Hewlett Packard Enterprise Patent Department

(57) ABSTRACT

A template of instructions may be copied from a non-volatile memory (NVM) to a plurality of cache lines of an instruction cache of a processor. The instructions of the templates copied to the instruction cache may be executed. The templates may include a conditional branch instruction to determine if to proceed to a next template of the plurality of copied templates.

15 Claims, 4 Drawing Sheets

(56) References Cited

OTHER PUBLICATIONS

International Searching Authority, The International Search Report and the Written Opinion, PCT/US2014/049026, dated Apr. 7, 2015, 13 Pgs.

Theodorou et al.; "Software-based Self Test Methodology for On-line Testing of L1 Caches in Multithreaded Multicore Architectures", Apr. 4, 2013, 5 Pgs.

* cited by examiner

TEMPLATE COPY TO CACHE

BACKGROUND

Due to the dynamics of the information era and its demanding nature, the bar for information technology (IT) companies to produce highly reliable equipment is constantly being raised. The reliability of IT equipment may be a significant factor to designing highly fault tolerant datacenters. As such, processor vendors may need to account for imperfections in the manufacturing process through the use of appropriate stress tests.

Such tests may ensure proper coverage to validate safe operation in the face of issues such as process variation and circuit aging prior to shipment. This problem may be exacerbated as the process technology continues to shrink making CMOS based designs less reliable. Caches are generally one of the most susceptible structures due to their sensitivity to imbalances in transistor behavior present in a given static random access memory (SRAM) cell.

BRIEF DESCRIPTION OF THE DRAWINGS

The following detailed description references the drawings, wherein.

DETAILED DESCRIPTION

Figure 1:
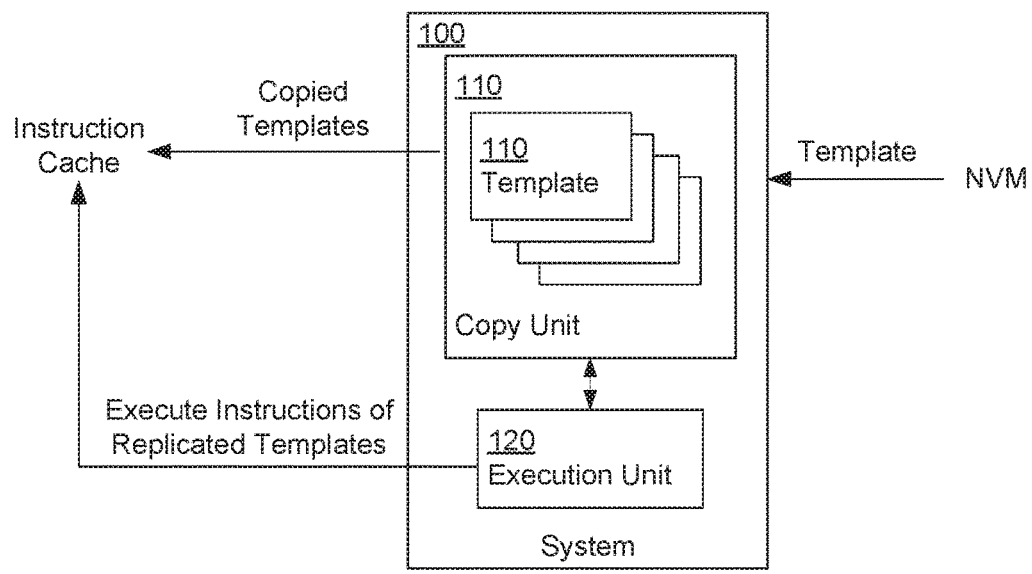
FIG. 1 is an example block diagram of a system to copy a template to a cache.

Specific details are given in the following description to provide a thorough understanding of embodiments. However, it will be understood that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Many processors employ split cache architectures as a way to improve performance through the reduction of coherency related traffic in a multiprocessor setting. However, using instruction caches adds a dimension of complications when dynamically performing cache self-tests in order to adapt to changes in operating conditions. Not having an effective mechanism to adequately test such caches can lead to increases in test escapes, which may in turn affect end user experience.

Thus, examples may provide a dynamic mechanism for systematically targeting a specific cache line and/or set of cache lines in a processor, such as via software. Examples may provide an online approach through software for performing localized testing of cache lines that are in the instruction cache. This may be done through dynamic construction of instructions with appropriately positioned branches. The branches may ensure a given cache index is stressed through a burst of accesses to the same line. In one example, a template of instructions may be copied from a non-volatile memory (NVM) to a plurality of cache lines of an instruction cache of a processor. The instructions of the templates copied to the instruction cache may be executed. The templates may include a conditional branch instruction to determine if to return to a call or proceed to a next template of the plurality of copied templates, based on the cache line being accessed by the template Examples may enable adequate stressing of cache lines that are in instructions caches through a burst of accesses to the same line. Examples may also eliminate the need for adding special hooks in hardware to enable targeted test coverage in instruction caches. Using hardware to perform such tests may increase overall power consumption of the chip as well as costs, due to additional logic needed to conduct such tests, such as for processors like system-on-chips (SoCs) that are inexpensive and geared toward low power operation.

Examples may also be architecture independent and may scale to different technologies such as resistive memory including spin-transfer torque random-access memory (STT-RAM) and phase-change memory (PCM). Further, examples may provide an ability to detect cache lines mapped to weaker cells through targeted testing to facilitate an adaptive approach to disabling weak lines in the event of changes to the operating conditions such as temperature after the system has been deployed in the field.

In addition, an online targeted test could be used to reliably operate in the Near Threshold Computing (NTC) range. This range may be suitable for low power operation, especially in mobile devices and cloud based datacenters. As the voltage is aggressively lowered to approach the NTC range, process variation effects such as Random Dopant Factors (RDF) may become amplified.

Having a targeted cache line self-test may be used to isolate the weak lines to be disabled in order to drive the core voltage lower and achieve aggressive power savings. Finally, circuit aging in CMOS based designs may necessitate an ability to have online tests that could be periodically launched to isolate weakened cells after a processor has been deployed.

Examples are relatively simple to implement and is scalable. Further, examples have the advantage of being inexpensive and power efficient relative to hardware since examples do not require additional circuitry that would consume power (dynamic and leakage power) for phases that are otherwise short lived. Examples may be adaptive as part of an online solution that could be periodically triggered to detect issues induced by changes in operating conditions and circuit aging. Examples also may enable low power operation, such as in the NTC range by effectively detecting and disabling weak cache lines to aggressively lower voltage.

Referring now to the drawings, FIG. 1 is an example block diagram of a system 100 to copy a template to a cache. The system 100 may interface with or be included in any type of device accessing a cache, such as a controller, a central process unit (CPU), a notebook computer, a desktop computer, an all-in-one system, a server, a network device, a wireless device, a storage device, a mobile device, a thin client, a retail point of sale device, a gaming device, a scientific instrument, and the like.

The system 100 is shown to include a copy unit 110 and an execution unit 120. The copy and execution units 110 and 120 may include, for example, a hardware device including electronic circuitry for implementing the functionality described below, such as control logic and/or memory. In addition or as an alternative, the copy and execution units 110 and 120 may be implemented as a series of instructions encoded on a machine-readable storage medium and executable by a processor.

The copy unit 110 may sequentially replicate a template 110 of instructions from a non-volatile memory (NVM) to a plurality of cache lines of an instruction cache of a processor. The execution unit 120 may execute the instructions of the replicated templates to stress the plurality of cache lines. Each of the templates may include a conditional branch to branch to an adjacent template of the replicated templates based on an offset. The execution unit 120 may execute at least one of the replicated templates a plurality of times before executing the adjacent template, based on a loop included in the template.

Figure 2:
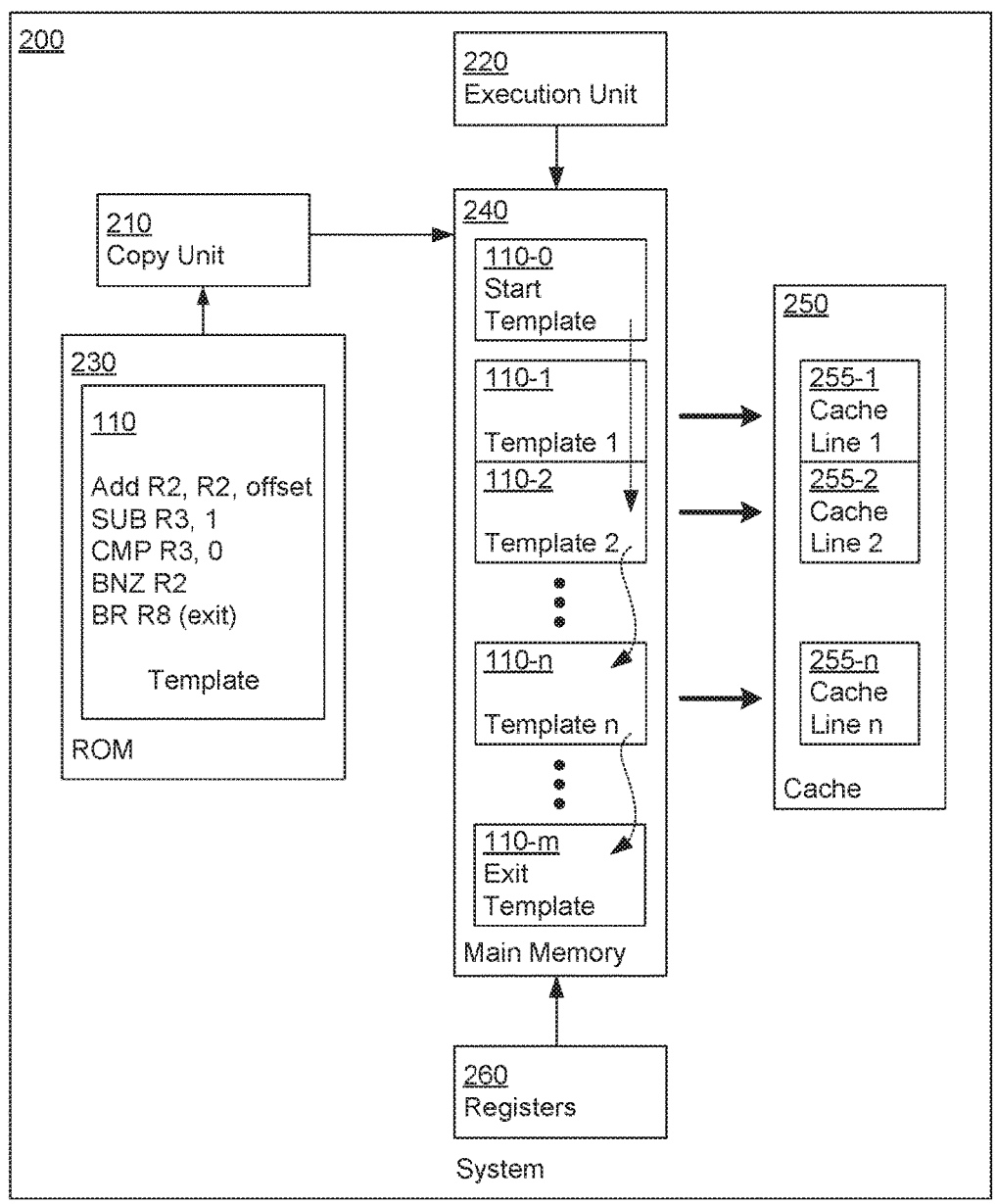
FIG. 2 is another example block diagram of a system to copy a template to a cache.

FIG. 2 is another example block diagram of a system 200 to copy a template to a cache. The system 200 may interface with or be included in any type of device accessing a cache, such as a controller, a central process unit (CPU), a notebook computer, a desktop computer, an all-in-one system, a server, a network device, a wireless device, a storage device, a mobile device, a thin client, a retail point of sale device, a gaming device, a scientific instrument, and the like.

The system 200 of FIG. 2 may at least include the functionality and/or hardware of the system 100 of FIG. 1. For example, the system 200 includes a copying unit 210 and an execution unit 220 that respectively includes at least the functionality and/or hardware of the copying and execution units 110 and 120 of FIG. 1. The system 200 is further shown include a read-only memory (ROM) 230, a main memory 240, and a cache 250. The ROM 230 may refer to memory on which data has been prerecorded. Once data has been written to the ROM 230, it may not be removed and may only be read. The main memory 240 may refer to physical memory that is internal to the computer, such as random access memory (RAM), which may refer to a type of computer memory that can be accessed randomly;

The cache 250 may be a block of memory for temporary storage of data likely to be used again. The cache 250 may store data so that future requests for that data may be served faster. The data that is stored within the cache 250 might be values that have been computed earlier or duplicates of original values that are stored elsewhere. The cache 250 may be used by the CPU (not shown) of a computer to reduce the average time to access memory. For example, the cache 250 may be a smaller, faster memory which stores copies of the data from frequently used main memory locations. Here, the cache 250 may include an instruction cache to speed up executable instruction fetch.

If the system 200 includes a chip multiprocessor (CMP), a monarch or main thread is selected for each core within the CMP to run a self-test. Slave threads that haven't been selected as a monarch are halted in order to not induce any cache pollution while the main thread conducts the self-test. Once the slave threads have been halted, the main thread allocates memory to be used for the self-test.

The self-test is conducted after the main thread has been selected and memory has been allocated. The monarch thread builds the stress test on the fly, such as by the copying unit 210 copying the template 110 that is flashed in the ROM 230 to the main memory 240. The template 110 may have the property of matching an instruction cache line 255 of the cache 250 in size. If a lower level cache (not shown) of the cache 250 uses larger cache line sizes, conditional branches may be used to control the size of executed instructions. As such, the size of the template 110 may match the smallest cache line size available within the processor.

The copying unit 210 may copy template 110 from the ROM 230 and sequentially replicate it throughout the main memory 240. Each of the templates 110 may end with a conditional branch that determines if execution is to return to a caller or proceed to the next requested template 110, depending on which cache line 255 is being stressed.

A plurality of the copied templates 110-0 to 110-$m$ may then be combined through the appropriate number of untaken branches to allow linear execution by the execution unit 220 of a full cache line 255 before branching to the next location. If a full sweep of the instruction cache 250 is desired, the code simply branches to the immediately adjacent template using an appropriate offset. Assuming a cache line size of 64 bytes, an offset to use in this case may be 64.

To kick off the test, the execution unit 220 may branch to a start template 110-0 of the plurality of copied templates 110-0 to 110-$m$, where m and n are natural numbers. The start template 110-0 may compute the offset (where an offset is a multiple of the cache line size) to use based on the requested cache line 255 to stress. The start template may add the offset to a base address where the base address maps to the location of a first template 110-1 of the plurality of copied templates 110-0 to 110-$m$. The start template 110-0 may also set up different registers 260 for tracking purposes such as tracking of the number of times to spin on a given template 110.

The base address and/or offset may be also stored at the register 260 and/or main memory. The start template 110-0 may to set up a plurality of the registers 260 to correspond to the plurality of copied templates 110-1 to 110-$n$. Here, the start template 110-0 is shown to skip the first template 110-1 and cause execution to start at the second template 110-2 of the plurality of copied templates 110-1 to 110-$m$, based on the requested cache line 255.

Example instructions are shown within the template 110. Here, are the instructions are shown in assembly language with R2, R3 and R8 representing different registers 260, but examples may use various languages. Execution of the small set of instructions within each template 110 may be followed by a branch that continues at the appropriate offsets to properly stress all the ways that map to a given cache index (e.g. "add R2, R2, offset" and "BNZ R2"). A loop within the template 110 (e.g. "SUB R3, 1" and "CMP R3, 0") may be used to re-execute a given template 110 multiple times before branching on to the next template. This may ensure that each cache line 255 in the way is properly stress tested. This may also work around any least recently used (LRU) related effects present within cache designs. A counter, such as at the registers 260, may be maintained to determine a number of branches needed to stress the intended indices and ways based on the set associativity of the cache being tested.

Figure 3:
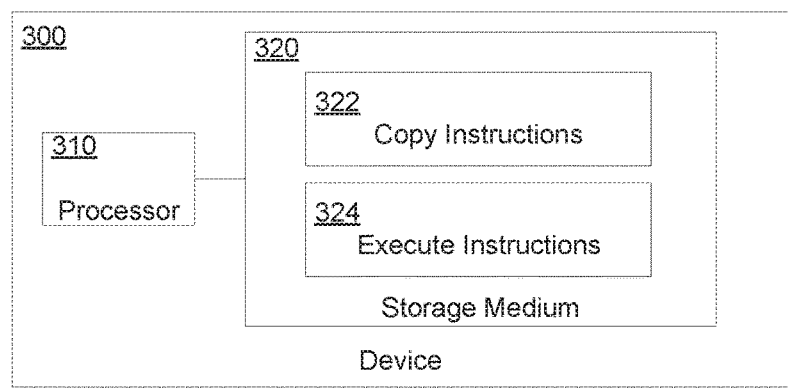
FIG. 3 is an example block diagram of a computing device including instructions for copying a template to a cache.

FIG. 3 is an example block diagram of a computing device 300 including instructions for copying a template to a cache. In the embodiment of FIG. 3, the computing device 300 includes a processor 310 and a machine-readable storage medium 320. The machine-readable storage medium 320 further includes instructions 322 and 324 for copying the template to the cache.

The computing device 300 may be or part of, for example, a controller, a central process unit (CPU), a notebook computer, a desktop computer, an all-in-one system, a server, a network device, a wireless device, a storage device, a mobile device, a thin client, a retail point of sale device, a gaming device, a scientific instrument, or any other type of device capable of executing the instructions 322 and 324. In certain examples, the computing device 300 may include or be connected to additional components such as memories, sensors, displays, etc.

The processor 310 may be, at least one central processing unit (CPU), at least one semiconductor-based microprocessor, at least one graphics processing unit (GPU), other hardware devices suitable for retrieval and execution of instructions stored in the machine-readable storage medium 320, or combinations thereof. The processor 310 may fetch, decode, and execute instructions 322 and 324 for copying the template to the cache. As an alternative or in addition to retrieving and executing instructions, the processor 310 may include at least one integrated circuit (IC), other control logic, other electronic circuits, or combinations thereof that include a number of electronic components for performing the functionality of instructions 322 and 324.

The machine-readable storage medium 320 may be any electronic, magnetic, optical, or other physical storage device that contains or stores executable instructions. Thus, the machine-readable storage medium 320 may be, for example, Random Access Memory (RAM), an Electrically Erasable Programmable Read-Only Memory (EEPROM), a storage drive, a Compact Disc Read Only Memory (CD-ROM), and the like. As such, the machine-readable storage medium 320 can be non-transitory. As described in detail below, machine-readable storage medium 320 may be encoded with a series of executable instructions for copying the template to the cache.

Figure 4:
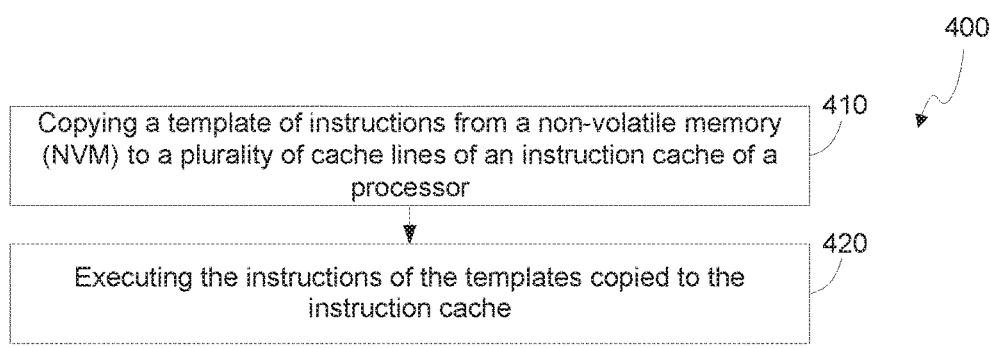
FIG. 4 is an example flowchart of a method for copying a template to a cache.

Moreover, the instructions 322 and 324 when executed by a processor (e.g., via one processing element or multiple processing elements of the processor) can cause the processor to perform processes, such as, the process of FIG. 4. For example, the copy instructions 322 may be executed by the processor 310 to copy a template to a cache of a processor, the template to include instructions and to match a size of a cache line of the processor. The execute instructions 324 may be executed by the processor 310 to execute the template a plurality of times to stress the cache line including the template.

A number of the times the cache line is stressed may be determined by the template. The template may be copied a plurality of times to a plurality of cache lines. At least one of the templates may branch to another of the templates based on an offset included in the template. The plurality of templates may be combined through a number of untaken branches to allow linear execution of a full cache line before branching to a next location.

FIG. 4 is an example flowchart of a method 400 for copying a template to a cache. Although execution of the method 500 is described below with reference to the system 200, other suitable components for execution of the method 500 can be utilized, such as the system 100. Additionally, the components for executing the method 500 may be spread among multiple system and/or devices (e.g., a processing device in communication with input and output devices). In certain scenarios, multiple devices acting in coordination can be considered a single device to perform the method 500. The method 500 may be implemented in the form of executable instructions stored on a machine-readable storage medium, such as storage medium 420, and/or in the form of electronic circuitry.

At block 410, the system 200 copies a template of instructions from a non-volatile memory (NVM) 230 to a plurality of cache lines 255 of an instruction cache 250 of a processor. At block 420, the system 200 executes the instructions of the templates 110 copied to the instruction cache 250. Each of the templates 110 may include a conditional branch instruction to determine if the execution at least one of returns to a call and proceeds to a next template 110 of the plurality of copied templates 110, based on the cache line 255 being accessed by the template 110.

Figure 5:
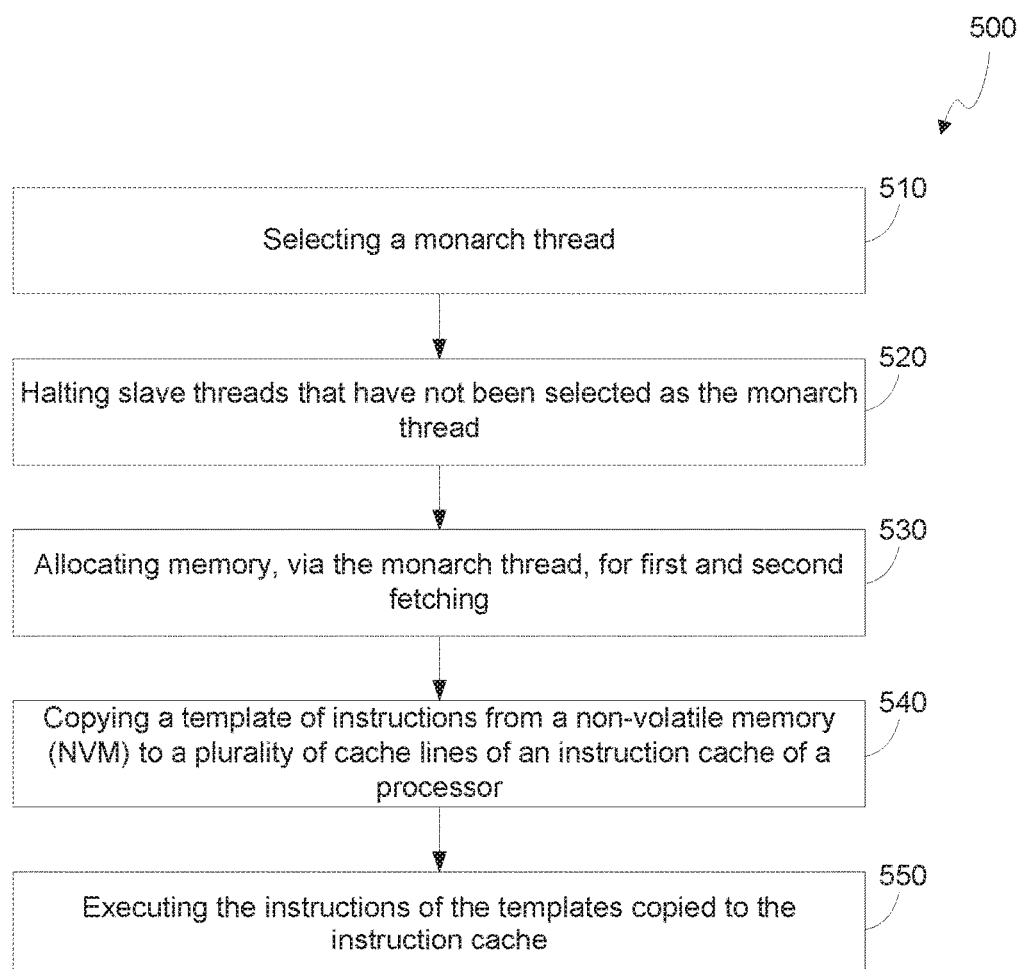
FIG. 5 is another example flowchart of a method for copying a template to a cache.

FIG. 5 is another example flowchart of a method 500 for copying a template to a cache. Although execution of the method 500 is described below with reference to the system 200, other suitable components for execution of the method 500 can be utilized, such as the system 100. Additionally, the components for executing the method 500 may be spread among multiple system and/or devices (e.g., a processing device in communication with input and output devices). In certain scenarios, multiple devices acting in coordination can be considered a single device to perform the method 500. The method 500 may be implemented in the form of executable instructions stored on a machine-readable storage medium, such as storage medium 320, and/or in the form of electronic circuitry.

At block 510, the system 200 selects a monarch thread. Then, at block 520, the system 200 halts slave threads that have not been selected as the monarch thread. Next, at block 530, the system 200 allocates memory, via the monarch thread, for the first and second fetching. At block 540, the system 200 copies a template of instructions from a non-volatile memory (NVM) 230 to a plurality of cache lines 255 of an instruction cache 250 of a processor.

At block 550, the system 200 executes the instructions of the templates 110 copied to the instruction cache 250. Each of the templates 110 may include a conditional branch instruction to determine if the execution at least one of returns to a call and proceeds to a next template 110 of the plurality of copied templates 110, based on the cache line 255 being accessed by the template 110.

We claim:

1. A method, comprising:
    copying a template of instructions multiple times from a non-volatile memory (NVM) to a plurality of cache lines of an instruction cache of a processor to generate a plurality of copied templates; and
    performing testing of the cache lines by executing the instructions of the template copied to the instruction cache to stress the plurality of cache lines,
    wherein each of the copied templates includes a conditional branch instruction to determine if the execution returns to a call or proceeds to a next template of the plurality of copied templates, based on the cache line being accessed by the respective template.

2. The method of claim 1, wherein the conditional branch instruction branches based on an offset, the offset based on a size of a cache line of the cache.

3. The method of claim 2, wherein the offset of the conditional branch instructions of the plurality of copied templates are set to stress all ways that map to a cache index of the cache.

4. The method of claim 2, wherein the executing begins with a start template of the plurality of copied templates, the start template to compute the offset based on a requested cache line.

5. The method of claim 4, wherein the start template adds the offset to a base address where the base address maps to a location of a next template of the plurality of copied templates.

6. The method of claim 4, wherein the start template is to set up a register to track a number of times to repeat the execution of the instructions of the template.

7. The method of claim 4, wherein,
the start template is to set up a plurality of the registers to correspond to the plurality of copied templates,
the NVM includes firmware, and
the NVM is a Read-Only Memory (ROM).

8. The method of claim 1, wherein the copying of the template of instructions sequentially replicates the template throughout allocated physical memory corresponding to the instruction cache.

9. The method of claim 1, wherein each of the copied templates includes a loop to have the respective template be executed a plurality of times to stress the corresponding cache line, before the conditional branch instruction branches to the next template.

10. The method of claim 1, further comprising:
selecting a monarch thread;
halting slave threads that have not been selected as the monarch thread; and
allocating memory, via the monarch thread, for the copying.

11. The method of claim 1, wherein,
a size of the instruction template is at least equal to a smallest size of an instruction cache line of the instruction cache, and
an offset is to be a multiple of the smallest size, wherein the conditional branch instruction branches based on the offset.

12. A system, comprising:
a copy unit to replicate a template of instructions from a non-volatile memory (NVM) to a plurality of cache lines of an instruction cache of a processor; and
an execution unit to execute the instructions of the replicated templates to stress the plurality of cache lines, wherein
each of the replicated templates includes a conditional branch to branch to an adjacent template of the replicated templates based on an offset.

13. The system of claim 12, wherein the execution unit is to execute at least one of the replicated templates a plurality of times before executing the adjacent template, based on a loop included in the template of instructions that is replicated.

14. A non-transitory computer-readable storage medium storing instructions that, if executed by a processor of a device, cause the processor to:
copy a template to a cache of a processor, the template to include instructions and to match a size of a cache line of the processor; and
execute the template a plurality of times to stress the cache line including the template, a number of the times the cache line is stressed to be determined by the template, wherein
the template is copied a plurality of times to a plurality of cache lines, and
at least one of the templates branches to another of the templates based on an offset included in the template.

15. The non-transitory computer-readable storage medium of claim 14, wherein the plurality of the templates are combined through a number of untaken branches to allow linear execution of a full cache line before branching to a next location.

* * * * *